United States Patent
Fujii et al.

(10) Patent No.: US 9,947,685 B2
(45) Date of Patent: Apr. 17, 2018

(54) 3D NON-VOLATILE MEMORY ARRAY UTILIZING METAL ION SOURCE

(71) Applicant: Toshiba Memory Corporation, Minato-ku (JP)

(72) Inventors: Shosuke Fujii, Kuwana (JP); Kazuhiko Yamamoto, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/264,919

(22) Filed: Sep. 14, 2016

(65) Prior Publication Data
US 2017/0271360 A1    Sep. 21, 2017

(30) Foreign Application Priority Data
Mar. 16, 2016   (JP) .................................. 2016-053064

(51) Int. Cl.
*H01L 27/115*       (2017.01)
*H01L 27/11582*     (2017.01)
(Continued)

(52) U.S. Cl.
CPC ........ *H01L 27/11582* (2013.01); *G11C 16/04* (2013.01); *G11C 16/06* (2013.01);
(Continued)

(58) Field of Classification Search
CPC ......... H01L 27/11582; H01L 27/11556; H01L 23/5283; H01L 27/11524; H01L 27/1157; H01L 45/085; G11C 16/06; G11C 16/04
See application file for complete search history.

(56) References Cited

U.S. PATENT DOCUMENTS 9,076,723 B1 *  7/2015  Matsunami ........... H01L 45/085
2011/0007555 A1  1/2011  Ito
(Continued)

FOREIGN PATENT DOCUMENTS

JP   2010-27984   2/2010
JP   2012-69612   4/2012
(Continued)

OTHER PUBLICATIONS

Daisaburo Takashima, et al., "High-Density Chain Ferroelectric Random Access Memory (Chain FRAM)," IEEE Journal of Solid-State Circuits, vol. 33, No. 5, May 1998, 6 pages.
(Continued)

*Primary Examiner* — Ajay Ojha
(74) *Attorney, Agent, or Firm* — Oblon, McClelland, Maier & Neustadt, L.L.P.

(57) ABSTRACT

According to one embodiment, a semiconductor memory device includes a semiconductor layer, a plurality of conductive layers, a plurality of insulating layers, an intermediate layer, and a controller. The conductive layers and the insulating layers are alternately provided. The intermediate layer is provided between the plurality of conductive layers and the semiconductor layer. The controller is configured to perform first and second operations. In first operation, the controller applies a first voltage to the semiconductor layer, applies a second voltage higher than the first voltage to a first conductive layer, and applies a third voltage to other conductive layers. In the second operation, the controller applies a fourth voltage to the semiconductor layer, applies a fifth voltage to the first conductive layer, and applies a sixth voltage to the other conductive layers.

19 Claims, 2 Drawing Sheets

(51) Int. Cl.
H01L 27/11556 (2017.01)
H01L 23/528 (2006.01)
G11C 16/04 (2006.01)
G11C 16/06 (2006.01)
H01L 27/1157 (2017.01)
H01L 27/11524 (2017.01)
H01L 45/00 (2006.01)

(52) U.S. Cl.
CPC ...... *H01L 23/5283* (2013.01); *H01L 27/1157* (2013.01); *H01L 27/11524* (2013.01); *H01L 27/11556* (2013.01); *H01L 45/085* (2013.01); *G11C 16/0433* (2013.01)

(56) References Cited

U.S. PATENT DOCUMENTS

| | | | |
|---|---|---|---|
| 2012/0063223 A1* | 3/2012 | Lee | G11C 16/0433 365/185.02 |
| 2012/0205608 A1* | 8/2012 | Yamauchi | H01L 45/085 257/4 |
| 2013/0079230 A1 | 3/2013 | Poppe et al. | |
| 2013/0140648 A1 | 6/2013 | Hasegawa et al. | |
| 2015/0380418 A1* | 12/2015 | Zhang | H01L 27/11529 257/326 |
| 2016/0071861 A1* | 3/2016 | Serov | H01L 27/11556 365/185.19 |

FOREIGN PATENT DOCUMENTS

| | | |
|---|---|---|
| JP | 2013-26389 | 2/2013 |
| JP | 2013-535805 | 9/2013 |
| JP | 2015-60911 | 3/2015 |
| WO | WO 2009/116564 A1 | 9/2009 |

OTHER PUBLICATIONS

Tsuyoshi Hasegawa, et al., "Volatile/Nonvolatile Dual-Functional Atom Transistor," Applied Physics Express 4, 2011, pp. 015204-1-015204-3 (with cover page).

* cited by examiner

3D NON-VOLATILE MEMORY ARRAY UTILIZING METAL ION SOURCE

CROSS-REFERENCE TO RELATED APPLICATIONS

This application is based upon and claims the benefit of priority from Japanese Patent Application No. 2016-053064, filed on Mar. 16, 2016; the entire contents of which are incorporated herein by reference.

FIELD

Embodiments described herein relate generally to a semiconductor memory device.

BACKGROUND

For example, there is a semiconductor memory device such as a NAND-type flash memory. In the semiconductor memory device, an improvement in storage density is desired.

DETAILED DESCRIPTION

Figure 1A:
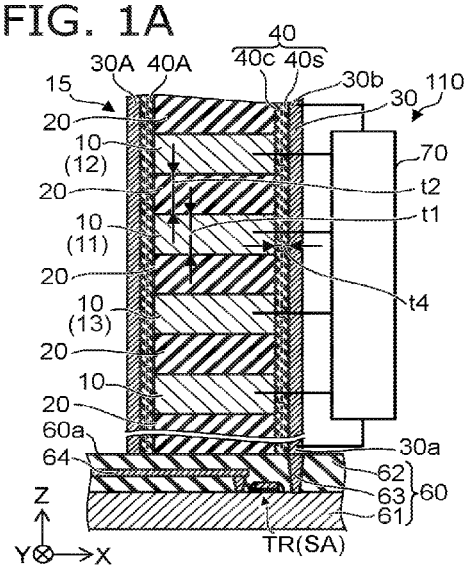
FIG. 1A to FIG. 1F are schematic views illustrating a semiconductor memory device according to a first embodiment.

According to one embodiment, a semiconductor memory device includes a semiconductor layer, a plurality of conductive layers, a plurality of insulating layers, an intermediate layer, and a controller. The semiconductor layer extends in a first direction and including a first end portion and a second end portion. The plurality of conductive layers and the plurality of insulating layers are alternately provided along the first direction. The intermediate layer is provided between the plurality of conductive layers and the semiconductor layer. The controller is electrically connected with the plurality of conductive layers and the semiconductor layer. The controller is configured to perform a first operation and a second operation. In first operation, the controller applies a first voltage to the semiconductor layer, applies a second voltage higher than the first voltage to a first conductive layer included in the plurality of conductive layers, and applies a third voltage between the first voltage and the second voltage to other conductive layers included in the plurality of conductive layers. In the second operation, the controller applies a fourth voltage to the semiconductor layer, applies a fifth voltage lower than the fourth voltage to the first conductive layer, and applies a sixth voltage to the other conductive layers. The fourth voltage is between the fifth voltage and the sixth voltage. A first electrical resistance between the first end portion and the second end portion in a first state after the first operation is lower than a second electrical resistance between the first end portion and the second end portion in a second state after the second operation.

Various embodiments will be described hereinafter with reference to the accompanying drawings.

The drawings are schematic or conceptual. The relationship between the thickness and the width of each portion, and the size ratio between the portions are not necessarily identical to those in reality. Furthermore, the same portion may be shown with different dimensions or ratios in different figures.

In the present specification and drawings, the same elements as those described previously with reference to earlier figures are labeled with like reference numerals, and the detailed description thereof is omitted as appropriate.

First Embodiment

FIG. 1A to FIG. 1F are schematic views illustrating a semiconductor memory device according to a first embodiment.

Figure 1B:
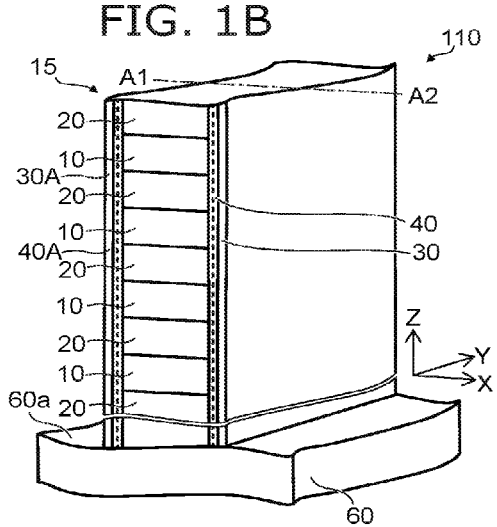
Figure 1C:
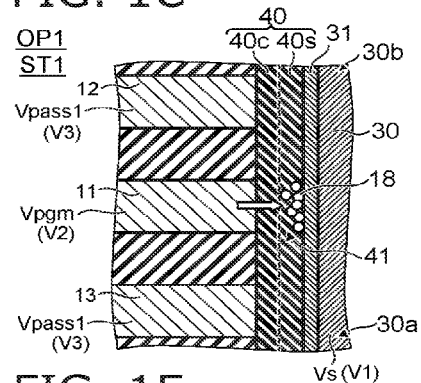
Figure 1D:
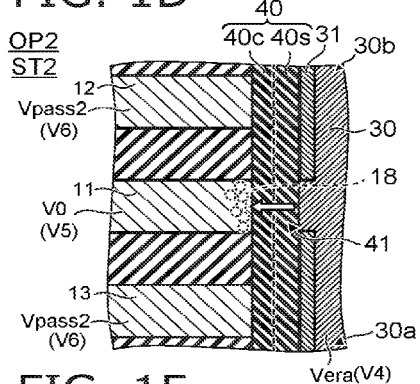
Figure 1E:
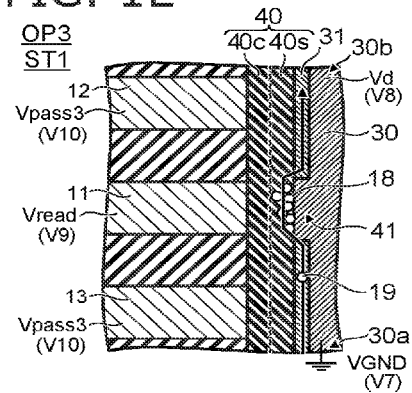
Figure 1F:
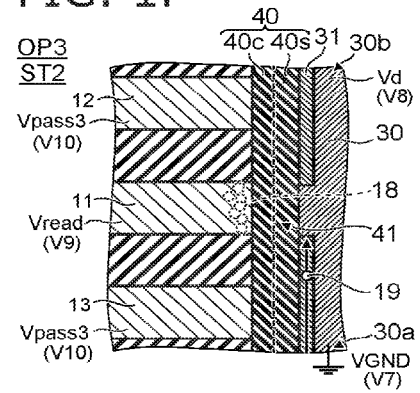

FIG. 1B is a perspective view. FIG. 1A is a sectional view along line A1-A2 in FIG. 1B. FIG. 1C illustrates a first operation of the semiconductor memory device. FIG. 1D illustrates a second operation of the semiconductor memory device. FIG. 1E and FIG. 1F illustrate a third operation of the semiconductor memory device.

As shown in FIG. 1A, the semiconductor memory device 110 according to the embodiment includes a semiconductor layer 30, a plurality of conductive layers 10, a plurality of insulating layers 20, an intermediate layer 40, and a controller 70.

The semiconductor layer 30 extends in a first direction. The semiconductor layer 30 includes a first end portion 30a and a second end portion 30b. The second end portion 30b is arranged with the first end portion 30a in the first direction.

The first direction is defined as a Z-axis direction. One direction vertical to the Z-axis direction is defined as an X-axis direction. A direction vertical to the X-axis direction and the Z-axis direction is defined as a Y-axis direction.

The plurality of conductive layers 10 and the plurality of insulating layers 20 are alternately provided along the first direction (Z-axis direction). The plurality of conductive layers 10 and the plurality of insulating layers 20 are included in a stacked member 15. The plurality of conductive layers 10 include, for example, a first conductive layer 11, a second conductive layer 12, and a third conductive layer 13.

The intermediate layer 40 is provided between, for example, the stacked member 15 and the semiconductor layer 30. The intermediate layer 40 is provided between the plurality of conductive layers 10 and the semiconductor layer 30. For example, the intermediate layer 40 is in contact with the plurality of conductive layers 10 and in contact with the semiconductor layer 30.

The controller 70 is electrically connected with the plurality of conductive layers 10 and the semiconductor layer 30.

In this example, a base member 60 is provided in the semiconductor memory device 110. The base member 60 includes a first face 60a. For example, the plurality of conductive layers 10, the plurality of insulating layers 20, the semiconductor layer 30, and the intermediate layer 40 are provided on the first face 60a. In this example, the base member 60 includes a semiconductor substrate 61.

For example, at least a portion of the controller 70 may be provided on the semiconductor substrate 61.

In this example, the semiconductor substrate 61 includes a transistor TR. For example, the semiconductor layer 30 is connected with the transistor TR (e.g., any of a source region and a drain region of the transistor TR) by means of, for example, a connection conductive layer 63. The transistor TR may function as, for example, at least a portion of a sense amplifier SA. For example, the transistor TR may function as at least a portion of the controller 70.

As shown in FIG. 1B, in this example, the stacked member 15 including the plurality of conductive layers 10 and the plurality of insulating layers 20 extends in a second direction crossing the first direction. In this example, the second direction is the Y-axis direction. The second direction is substantially parallel to the first face 60a. The semiconductor layer 30 overlaps the plurality of conductive layers 10 in a third direction. The third direction crosses the first direction and the second direction. In this example, the third direction is the X-axis direction.

In this example, another semiconductor layer 30A and another intermediate layer 40A are further provided. The stacked member 15 is disposed between the semiconductor layer 30 and the semiconductor layer 30A in the third direction (X-axis direction). The intermediate layer 40A is provided between the stacked member 15 and the semiconductor layer 30A. The configurations of the semiconductor layer 30A and the intermediate layer 40A are similar to the configurations of the semiconductor layer 30 and the intermediate layer 40, and therefore, the description is omitted.

The plurality of conductive layers 10 contain, for example, a metallic element of at least any of copper and silver. The plurality of insulating layers 20 contain, for example, $SiO_2$.

The semiconductor layer 30 contains, for example, silicon. An example of the semiconductor layer 30 will be described later. The intermediate layer 40 contains, for example, at least any of $SiO_x$, SiON, $AlO_x$, $TaO_x$, $TiO_x$, $ZrO_x$, $GdO_x$, and $HfO_x$.

For example, when a voltage is applied between the semiconductor layer 30 and the conductive layer 10, the metallic element (e.g., ions) is injected from the conductive layer 10 into the intermediate layer 40. For example, the metallic element (e.g., ions) reaches the vicinity of an interface between the intermediate layer 40 and the semiconductor layer 30, and is precipitated as the metal. Due to this, the characteristics of a portion of the semiconductor layer 30 opposed to the conductive layer 10 to which the voltage is applied change. For example, an electrical resistance between the first end portion 30a and the second end portion 30b of the semiconductor layer 30 changes. This change in characteristics is used for the storage of information.

In the intermediate layer 40, a region between each of the plurality of conductive layers 10 and the semiconductor layer 30 corresponds to a storage region (memory cell). For example, the intermediate layer 40 includes a first region 41 between the first conductive layer 11 and the semiconductor layer 30. The first region 41 corresponds to a first memory region (first memory cell). In the following example, the first memory cell corresponds to a selected cell. The intermediate layer 40 includes regions (other regions) between other conductive layers 10 and the semiconductor layer 30. These other regions correspond to other memory regions (other memory cells). These other memory cells correspond to non-selected cells.

The controller 70 performs a plurality of operations. In the following example, information is programmed to or erased from the first region 41 (selected cell). Information retained in the other regions (non-selected cells) is held.

FIG. 1C illustrates a first operation OP1. In the first operation OP1, programming is performed to the selected cell. FIG. 1D illustrates a second operation OP2. In the second operation OP2, erasing of the selected cell is performed. These operations are performed by, for example, the controller 70.

As shown in FIG. 1C, the following is performed in the first operation OP1. The controller 70 applies a first voltage V1 (Vs) to the semiconductor layer 30. The controller 70 applies a second voltage V2 (Vpgm) to the first conductive layer 11 (selected cell). The second voltage V2 is higher than the first voltage V1. The controller 70 applies a third voltage V3 (Vpass1) to the other conductive layers 10 (non-selected cells, for example, the second conductive layer 12, the third conductive layer 13, etc.) included in the plurality of conductive layers 10. The third voltage V3 is a voltage between the first voltage V1 and the second voltage V2. By the first operation OP1, a first state ST1 is formed in the selected cell.

An electric current flows from a conductor to which a high voltage is applied toward a conductor to which a low voltage is applied. A metallic element (e.g., ions) moves. Electrons move from the conductor to which the low voltage is applied toward the conductor to which the high voltage is applied.

The first voltage V1 (Vs) is, for example, 0 V (volts) (e.g., the ground potential). The second voltage V2 (Vpgm) is, for example, from 5 V to 7 V. The third voltage V3 (Vpass1) is, for example, from 2 V to 3 V. In the specification, the case where the conductor is set to 0 V (e.g., the ground potential) is also described as "applying a voltage".

As shown in FIG. 1D, the following is performed in the second operation OP2. The controller 70 applies a fourth voltage V4 (Vera) to the semiconductor layer 30. The controller 70 applies a fifth voltage V5 (V0) to the first conductive layer 11 (selected cell). The fifth voltage V5 is lower than the fourth voltage V4. The controller 70 applies a sixth voltage V6 (Vpass2) to the other conductive layers 10 (non-selected cells). The fourth voltage V4 is between the fifth voltage V5 and the sixth voltage V6. By the second operation OP2, a second state ST2 is formed in the selected cell.

The fourth voltage V4 (Vera) is, for example, from 4 V to 6 V. The fifth voltage V5 (V0) is, for example, 0 V (e.g., the ground potential). The sixth voltage V6 (Vpass2) is, for example, from 7 V to 8 V.

An electrical resistance (first electrical resistance) between the first end portion 30a and the second end portion 30b in the first state ST1 after the first operation OP1 is lower than an electrical resistance (second electrical resistance) between the first end portion 30a and the second end portion 30b in the second state ST2 after the second operation OP2.

The first state ST1 is one of data "1" and data "0" (e.g., the data "1"). The second state ST2 is the other of the data "1" and the data "0" (e.g., the data "0"). The first state ST1 is a program state. The second state ST2 is an erase state.

For example, in the first operation OP1, a metallic element 18 (e.g., metal ions) contained in the first conductive layer 11 is injected from the first conductive layer 11 into the first region 41 of the intermediate layer 40. The metal ions are, for example, at least any of Cu and Ag ions. For example, the metal ions are precipitated as the metal in the vicinity of the interface between the intermediate layer 40 and the semiconductor layer 30. This state corresponds to a low resistance state. In the first operation OP1, the second voltage V2 (Vpgm) or the third voltage V3 (Vpass1) is applied to the conductive layer 10. At this time, an inversion layer 31 may be formed in the semiconductor layer 30.

For example, in the second operation OP2, the metallic element 18 (e.g., metal ions) injected into the intermediate layer 40 (the first region 41) moves to the first conductive layer 11. This state corresponds to a high resistance state. In the second operation OP2, the fifth voltage V5 (V0) or the sixth voltage V6 (Vpass2) is applied to the conductive layer 10. At this time, the inversion layer 31 may be formed in the semiconductor layer 30.

FIG. 1E and FIG. 1F illustrate a third operation OP3 (e.g., a read operation). In FIG. 1E, the selected cell is in the first state ST1 (program state). In FIG. 1F, the selected cell is in the second state ST2 (erase state).

In the third operation OP3, the controller 70 applies a seventh voltage V7 (VGND) to the first end portion 30a. The controller 70 applies an eighth voltage V8 (Vd) to the second end portion 30b. The eighth voltage V8 is higher than the seventh voltage V7. The controller 70 applies a ninth voltage V9 (Vread) to the first conductive layer 11 (selected cell). The controller 70 applies a tenth voltage V10 (Vpass3) to the other conductive layers 10 (non-selected cells).

The absolute value of the difference between the ninth voltage V9 (Vread) and the seventh voltage V7 (VGND) is smaller than the absolute value of the difference between the second voltage V2 (Vpgm) and the first voltage V1 (Vs). The absolute value of the difference between the tenth voltage V10 (Vpass3) and the seventh voltage V7 (VGND) is smaller than the absolute value of the difference between the second voltage V2 (Vpgm) and the first voltage V1 (Vs).

As shown in FIG. 1E, when the selected cell (the first conductive layer 11 and the first region 41) is in the first state ST1, the metallic element 18 is injected into the first region 41 for example. When the difference (Vd−VGND) between the seventh voltage V7 and the eighth voltage V8 is applied between the first end portion 30a and the second end portion 30b, an electron 19 flows from the first end portion 30a through a region corresponding to the non-selected cell in the semiconductor layer 30. After this, the electron 19 flows through a region into which the metallic element 18 is injected in the first region 41 of the intermediate layer 40. Then, the electron 19 flows through a region corresponding to the non-selected cell in the semiconductor layer 30, and reaches the second end portion 30b. Accordingly, the electron 19 flows between the first end portion 30a and the second end portion 30b. The low resistance state is established between the first end portion 30a and the second end portion 30b.

For example, the inversion layer 31 may be formed in the semiconductor layer 30 in the region corresponding to the non-selected cell in the semiconductor layer 30. On the other hand, the inversion layer 31 may not be formed in the semiconductor layer 30 in the region corresponding to the selected cell in the semiconductor layer 30.

As shown in FIG. 1F, when the selected cell (the first conductive layer 11 and the first region 41) is in the second state ST2, the metallic element 18 is not injected into the first region 41 for example. When the difference (Vd−VGND) between the seventh voltage V7 and the eighth voltage V8 is applied between the first end portion 30a and the second end portion 30b, the electron 19 flows from the first end portion 30a through the region corresponding to the non-selected cell in the semiconductor layer 30. In the region corresponding to the selected cell in the semiconductor layer 30, the metallic element 18 is not present. For this reason, the electron 19 cannot pass through this region. For this reason, the high resistance state is established between the first end portion 30a and the second end portion 30b.

In the semiconductor memory device 110, the programming operation, the erase operation, and the read operation described above are performed. In the semiconductor memory device 110, the configuration is simple. In the semiconductor memory device 110, the storage density can be improved.

In the semiconductor memory device 110, for example, the concentration of the metallic element 18 in the first region 41 in the first state ST1 formed by the first operation OP1 is higher than the concentration of the metallic element 18 in the first region 41 in the second state ST2 formed by the second operation OP2. In the second state ST2, the metallic element 18 may not be provided in the first region 41. Due to a high concentration (e.g., a precipitated state) of the metallic element 18, the low resistance state is established between the first end portion 30a and the second end portion 30b.

As shown in FIG. 1A, the intermediate layer 40 includes a conductive layer-side region 40c and a semiconductor layer-side region 40s. The semiconductor layer-side region 40s is provided between the conductive layer-side region 40c and the semiconductor layer 30. That is, the first region 41 includes the conductive layer-side region 40c and the semiconductor layer-side region 40s. As shown in FIG. 1C, the concentration of the metallic element 18 in the semiconductor layer-side region 40s of the first region 41 in the first state ST1 is higher than the concentration of the metallic element 18 in the conductive layer-side region 40c of the first region 41 in the first state ST1. The metallic element 18 in the semiconductor layer-side region 40s of the first region 41 is, for example, the metal precipitated. For example, the low resistance state is established between the first end portion 30a and the second end portion 30b due to the metallic element 18 in the semiconductor layer-side region 40s of the first region 41. In the conductive layer-side region 40c of the first region 41, the concentration of the metallic element 18 is low, or the metallic element 18 is not provided. Due to this, the flowing of an electric current between the semiconductor layer 30 and the first conductive layer 11 is inhibited. Low power consumption is obtained.

A material may be different between the conductive layer-side region 40c and the semiconductor layer-side region 40s. For example, the pass-through property (diffusivity) of the metal contained in the conductive layer 10 may be different between these regions. For example, the pass-through property (diffusivity) of the metal contained in the conductive layer 10 in the conductive layer-side region 40c is higher than the pass-through property (diffusivity) of the metal contained in the conductive layer 10 in the semiconductor layer-side region 40s. Due to this, the ions of the metallic element 18 contained in the conductive layer 10 pass through the conductive layer-side region 40c to reach the semiconductor layer-side region 40s. For example, the ions of the metallic element 18 are precipitated in the semiconductor layer-side region 40s.

For example, when the intermediate layer 40 contains silicon, oxygen, and nitrogen, the concentration of nitrogen may be different between these regions. For example, the concentration of nitrogen in the semiconductor layer-side region 40s of the intermediate layer 40 is lower than the concentration of nitrogen in the conductive layer-side region 40c of the intermediate layer 40. The ions of the metallic element 18 contained in the conductive layer 10 pass through the conductive layer-side region 40c where the concentration of nitrogen is high to reach the semiconductor layer-side region 40s where the concentration of nitrogen is low. For example, the ions of the metallic element 18 are precipitated in the semiconductor layer-side region 40s.

In the semiconductor memory device 110, Vpass1 is applied to the non-selected cells in the first operation OP1 (programming operation). In the portion corresponding to the non-selected cell, for example, the inversion layer 31 is formed in the semiconductor layer 30 (semiconductor channel). In the inversion layer 31, carriers (electrons) are generated. In the first operation OP1 (programming operation), Vpgm is applied to the selected cell. In the portion corresponding to the selected cell, the inversion layer 31 is formed also in the semiconductor layer 30 (semiconductor channel), and carriers are generated.

For example, when the data "1" is programmed to the selected cell, Vpgm is set sufficiently higher than Vpass1. Due to this, the metallic element 18 contained in the conductive layer 10 (the first conductive layer 11) is ionized in the selected cell. The metallic element 18 is injected in the state of being positively charged into the intermediate layer 40. Due to an electric field, the metallic element 18 moves to the interface between the intermediate layer 40 and the semiconductor layer 30. Thereafter, the carriers (electrons) in the semiconductor layer 30 and the metal ions of the metallic element 18 are combined. Due to this, the ionized metallic element 18 becomes electrically neutral. The metallic element 18 is precipitated as the metal in a region of the intermediate layer 40 in contact with the semiconductor layer 30. Due to this, programming of the data "1" to the selected cell is performed.

In the first operation OP1, Vpass1 is applied to the selected cell. The ionization of the metal contained in the conductive layer 10 does not substantially occur due to the application of Vpass1. In the intermediate layer 40, the precipitation of the metal does not occur. The inversion layer 31 is formed in the semiconductor layer 30 due to the application of Vpass1. The voltage Vpass1 applied to the selected cell is low.

In the second operation OP2 (erase operation), reprogramming of the data from "1" to "0" is performed. At this time, Vera is applied to the semiconductor layer 30 (semiconductor channel), and V0 is applied to the selected cell. Vera is sufficiently higher than V0. Due to this, holes are generated in the semiconductor layer 30 (semiconductor channel). The holes combine with the metal ions precipitated in the intermediate layer 40. The metallic element 18 is ionized (positively charged). The voltage (V0) at the selected cell is lower than Vera. Due to this, the positively charged ions move from the intermediate layer 40 toward the conductive layer (the first conductive layer 11) due to an electric field. Due to this, erasing of the data is performed.

In the read operation, Vread is applied to a cell to be read (selected cell), and Vpass3 is applied to the other cells (non-selected cells). A potential difference between the both ends of the semiconductor layer 30 (semiconductor channel) is (Vd–VGND). Vread is a voltage at which the inversion layer 31 is not formed in the semiconductor layer 30 (semiconductor channel). Vread is lower than Vpass3. The inversion layer 31 is not formed in the semiconductor layer 30 (semiconductor channel) corresponding to the selected cell, and carriers are not generated. The inversion layer 31 is discontinuous at the portion corresponding to the selected cell.

When the data "1" is programmed to the selected cell, the metallic element 18 is precipitated in the intermediate layer 40 corresponding to the selected cell. For this reason, the electron 19 supplied from the first end portion 30a (source end) of the semiconductor layer 30 passes from the inversion layer 31 in the portion corresponding to the non-selected cell through a precipitated layer of the metallic element 18 and reach the second end portion 30b (drain end) of the semiconductor layer 30. The resistance between the source and the drain in this case is low.

On the other hand, when the data "0" is programmed to the selected cell, the metallic element 18 is not precipitated in the intermediate layer 40 corresponding to the selected cell. The inversion layer 31 is not formed in a portion of the semiconductor layer 30 corresponding to the selected cell. The electron 19 supplied from the source end does not reach the drain end. The resistance between the source and the drain in this case is high.

As described above, the states of the data "1" and the data "0" are distinguished from each other by the resistance between the source and the drain.

As described above, in the semiconductor memory device 110, for example, the metallic element 18 contained in the conductive layer 10 is used. For example, the configuration of the semiconductor memory device 110 is simpler than that of a reference example in which a transistor and a resistance change memory are connected in parallel. In the embodiment, the number of stacked films in the intermediate layer 40 is small. In the embodiment, the memory capacity can be made large.

For example, there is a reference example in which a charge storage layer (silicon nitride film) is provided between the plurality of conductive layers 10 and the semiconductor layer 30. For example, a silicon oxide film (block insulating film) is provided between the conductive layer 10 and the silicon nitride film. A silicon oxide film (tunnel insulating film) is provided between the semiconductor layer 30 and the silicon nitride film. In this reference example, in the first operation OP1, 0 V is applied to the semiconductor layer 30, and Vpgm (e.g., 5 V) is applied to the selected cell (the first conductive layer 11). Due to this, electrons are injected into the charge storage layer. In the second operation OP2, a voltage of opposite polarity is applied. In this reference example, the resistance between the source and the drain when electrons are injected into the charge storage layer is higher than the resistance between the source and the drain when electrons are not injected into the charge storage layer. That is, the high-and-low relationship of the resistance between the source and the drain in this reference example is the converse of the high-and-low relationship of the resistance between the source and the drain in the embodiment.

In the embodiment, the semiconductor layer 30 may contain, for example, at least any of polycrystalline silicon, single-crystal silicon, and amorphous silicon. The semiconductor layer 30 may contain an impurity (phosphorus, boron, etc.). The semiconductor layer 30 may contain a semiconductor material such as Ge. The semiconductor layer 30 may contain a compound semiconductor (SiC, GaAs, InP, etc.). The semiconductor layer 30 may contain an oxide semiconductor (InGaZnO, etc.).

A length t1 (thickness, see FIG. 1A) of the plurality of conductive layers 10 (the first conductive layer 11, etc.) in the first direction is, for example, 5 nanometers (nm) or more and 50 nm or less. When the thickness of the conductive layer 10 is excessively thin, the resistance of the conductive layer 10 becomes excessively high. When the thickness of the conductive layer 10 is excessively thick, the resistance between the source and the drain in the first state ST1 becomes high in, for example, the third operation OP3, and thus a difference in resistance between the first state ST1 and the second state ST2 becomes small. For this reason, a data read failure may occur.

A length t2 (thickness, see FIG. 1A) of one of the plurality of insulating layers 20 in the first direction is, for example, 5 nm or more and 50 nm or less. When the thickness of the insulating layer 20 is excessively thin, an insulation failure may occur between, for example, the upper and lower conductive layers. When the thickness of the insulating layer 20 is excessively thick, the inversion layer 31 does not reach the selected cell for example, and thus a data read failure may occur.

In the embodiment, a distance t4 (see FIG. 1A) between the conductive layer 10 (e.g., the first conductive layer 11) and the semiconductor layer 30 is, for example, 2 nm or more and 20 nm. The distance t4 corresponds to, for example, the thickness of the intermediate layer 40. When the distance t4 is thicker than 20 nm, an operating voltage rises for example. When the distance t4 is, for example, 10 nm or less, a low operating voltage is obtained. The low operating voltage is advantageous for increasing the storage capacity. When the distance t4 is excessively small, a current leakage is likely to occur between the conductive layer 10 and the semiconductor layer 30. When the distance t4 is 2 nm or more, the current leakage can be made small. Due to this, power consumption can be made small. The distance t4 may be, 2 nm or more and 10 nm or less.

Figure 2:
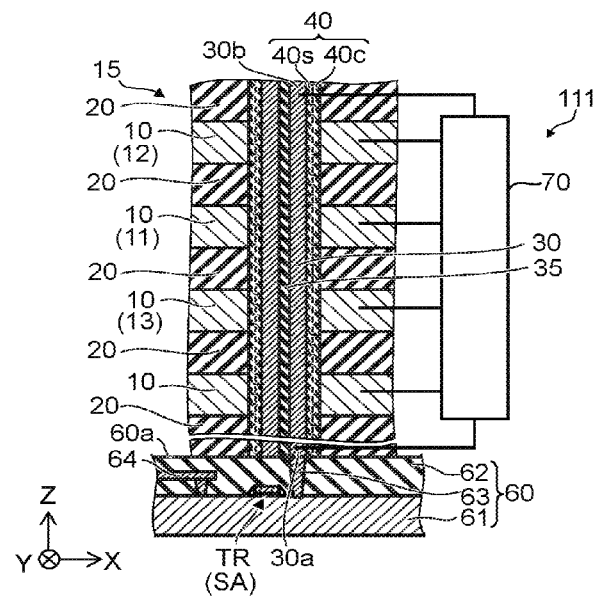
FIG. 2 is a schematic sectional view illustrating another semiconductor memory device according to the first embodiment.

FIG. 2 is a schematic sectional view illustrating another semiconductor memory device according to the first embodiment.

As shown in FIG. 2, in the semiconductor memory device 111 according to the embodiment, the semiconductor layer 30 extends in the stacked member 15 including the plurality of conductive layers 10 and the plurality of insulating layers 20 in the first direction (Z-axis direction).

In this example, the semiconductor layer 30 has a tubular shape. In this case, a core insulating layer 35 is provided. The core insulating layer 35 extends in the stacked member 15 along the first direction. The semiconductor layer 30 having a tubular shape is provided around the core insulating layer 35. The intermediate layer 40 having a tubular shape is provided around the semiconductor layer 30. The stacked member 15 is provided around the intermediate layer 40.

Also in the semiconductor memory device 111, operations (the first operation OP1, the second operation OP2, and the third operation OP3 similar to those of the semiconductor memory device 110 are performed. Also in the semiconductor memory device 111, the storage density can be improved.

Second Embodiment

Also in the embodiment, the stacked member 15 (the plurality of conductive layers 10 and the plurality of insulating layers 20), the semiconductor layer 30, the intermediate layer 40, and the controller 70 are provided. These structures are similar to the structures described with reference to, for example, FIG. 1A.

In the embodiment, the intermediate layer 40 contains an anatase-type titanium oxide ($TiO_x$, $0<x\leq2$). The semiconductor layer 30 contains silicon. The materials of the conductive layer 10 and the insulating layer 20 are arbitrary.

Also in the embodiment, the voltages described with reference to the semiconductor memory device 110 are applied in the first operation OP1, the second operation OP2, and the third operation OP3). In the embodiment, for example, the distribution of concentration of oxygen in the intermediate layer 40 is different between the first state ST1 and the second state ST2. Hereinafter, the first state ST1 and the second state ST2 in the embodiment will be described.

Figures 3A, 3B:
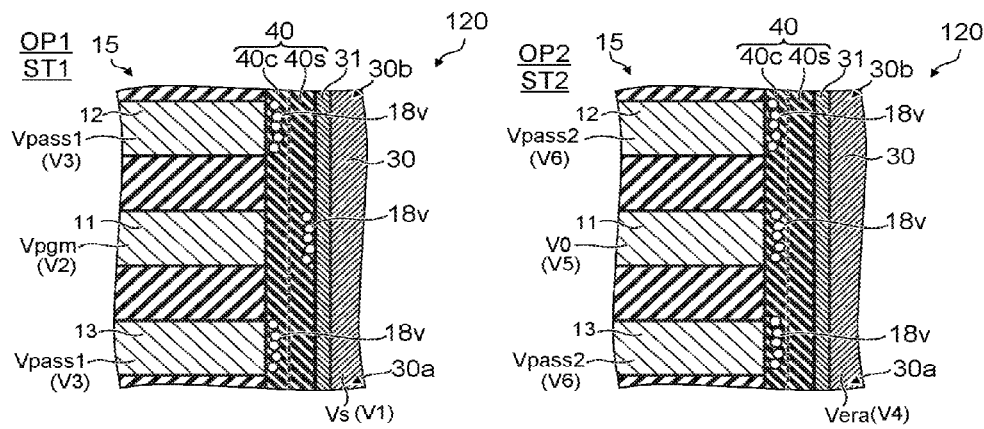
FIG. 3A and FIG. 3B are schematic views illustrating a semiconductor memory device according to a second embodiment.

FIG. 3A and FIG. 3B are schematic views illustrating a semiconductor memory device according to a second embodiment.

FIG. 3A illustrates the first operation OP1 of the semiconductor memory device 120. FIG. 3B illustrates the second operation OP2 of the semiconductor memory device 120.

As shown in FIG. 3A, in the first operation OP1, the controller 70 applies the first voltage V1 to the semiconductor layer 30, applies the second voltage V2 higher than the first voltage V1 to the first conductive layer 11 as the selected cell, and applies the third voltage V3 between the first voltage V1 and the second voltage V2 to the other conductive layers 10 as the non-selected cells.

As shown in FIG. 3B, in the second operation OP2, the controller 70 applies the fourth voltage V4 to the semiconductor layer 30, applies the fifth voltage V5 lower than the fourth voltage V4 to the first conductive layer 11 as the selected cell, and applies the sixth voltage V6 to the other conductive layers 10 as the non-selected cells. The fourth voltage V4 is between the fifth voltage V5 and the sixth voltage V6.

The first electrical resistance between the first end portion 30a and the second end portion 30b in the first state ST1 after the first operation OP1 is lower than the second electrical resistance between the first end portion 30a and the second end portion 30b in the second state ST2 after the second operation OP2.

The intermediate layer 40 includes the conductive layer-side region 40c and the semiconductor layer-side region 40s provided between the conductive layer-side region 40c and the semiconductor layer 30. The intermediate layer 40 includes the first region 41 (selected cell) between the first conductive layer 11 and the semiconductor layer 30. The concentration of oxygen in the semiconductor layer-side region 40s of the first region 41 in the first state ST1 is lower than the concentration of oxygen in the semiconductor layer-side region 40s of the first region 41 in the second state ST2.

As shown in FIG. 3A, in the first operation OP1, oxygen vacancies 18v are present in the conductive layer-side region 40c of the intermediate layer 40 in the non-selected cells (the portions corresponding to the other conductive layers 10). At this time, oxygen vacancies 18v are generated in the semiconductor layer-side region 40s of the intermediate layer 40 due to the application of the second voltage V2 (Vpgm) in the selected cell (the portion corresponding to the first conductive layer 11). For example, the conductivity is high in the region where the oxygen vacancies 18v are generated, compared with the region where the oxygen vacancies 18v are not generated.

As shown in FIG. 3B, in the second operation OP2, the oxygen vacancies 18v are generated in the conductive layer-side region 40c of the intermediate layer 40 due to the application of the fifth voltage V5 in the selected cell (the portion corresponding to the first conductive layer 11). For example, the oxygen vacancies 18v present in the semiconductor layer-side region 40s move to the conductive layer-side region 40c due to the application of the fifth voltage V5.

For example, the concentration of the oxygen vacancies 18v in the semiconductor layer-side region 40s of the first region 41 in the first state ST1 is higher than the concentration of the oxygen vacancies 18v in the semiconductor layer-side region 40s of the first region 41 in the second state ST2.

The conductivity is high in the region where the oxygen vacancies 18v are generated, compared with the region where the oxygen vacancies 18v are not generated. The conductivity of the semiconductor layer-side region 40s in the first state ST1 formed by the first operation OP1 is higher than the conductivity of the semiconductor layer-side region 40s in the second state ST2 formed by the second operation OP2. The first state ST1 and the second state ST2 described above are read by the third operation OP3 described with reference to FIG. 1E and FIG. 1F.

The concentration of the oxygen vacancies 18v in the semiconductor layer-side region 40s of the first region 41 in the first state ST1 is higher than the concentration of the oxygen vacancies 18v in the conductive layer-side region 40c of the first region 41 in the first state ST1. The concentration of oxygen in the semiconductor layer-side region 40s of the first region 41 in the first state ST1 is lower than the concentration of oxygen in the conductive layer-side region 40c of the first region 41 in the first state ST1. As described above, in the semiconductor memory device 120, the first state ST1 and the second state ST2 are formed by the distribution of concentration of oxygen.

In the semiconductor memory device 120, for example, Cu or Ag may not be contained in the conductive layer 10. The anatase-type titanium oxide is used for the intermediate layer 40. The oxygen vacancies 18v in the intermediate layer 40 are positively charged. For this reason, the oxygen vacancies 18v move to the vicinity of the interface between the intermediate layer 40 and the semiconductor layer 30 (semiconductor channel) due to the application of the second voltage V2 (Vpgm) in the first operation OP1. Due to this, the first state ST1 (the program state of the data "1") is obtained. On the other hand, the oxygen vacancies 18v move away from the vicinity of the interface between the intermediate layer 40 and the semiconductor layer 30 (semiconductor channel) due to the application of the fifth voltage V5 in the second operation OP2. The oxygen vacancies 18v are unevenly distributed in the conductive layer-side region 40c. Due to this, the second state ST2 (the erase state of the data "0") is obtained. The electrical resistance between the source and the drain in the first state ST1 is lower than the electrical resistance between the source and the drain in the second state ST2. The difference in resistance is read by the third operation OP3 (the read operation).

Also in the semiconductor memory device 120, the configuration is simple. Also in the semiconductor memory device 120, the storage density can be improved.

In the semiconductor memory device 120, the semiconductor layer 30 and the intermediate layer 40 may extend in the stacked member 15 along the first direction as illustrated in FIG. 2.

Instead of a large-capacity memory using a conventional three-terminal memory element, a large-capacity memory using a two-terminal memory is researched and developed. For example, a chain-type memory array in which a two-terminal memory and a select transistor are disposed in parallel is proposed. In a conventional chain-type memory array, a transistor and a memory cell are stacked in parallel in the vertical direction. For this reason, it is difficult to improve the density of memory cells.

In the embodiment, for example, one electrode of an ion movement-type memory (e.g., a conductive-bridge RAM (CBRAM), a vacancy-modulated conductive oxide resistive RAM (VMCO-RRAM; registered trademark), etc.) is used as a semiconductor channel. A select transistor and a memory element are integrated together. Due to this, the density of memory cells can be improved. A larger capacity of the memory can be achieved.

In the embodiment, for example, a semiconductor memory device includes a gate electrode (the conductive layer 10), a gate insulating film (the intermediate layer 40), and a semiconductor channel and a source-drain (the semiconductor layer 30). In the embodiment, electrical characteristics in the gate insulating film reversibly change. Due to this, the electrical resistance between the source and the drain reversibly changes. The memory cells adjacent to each other share a source-drain region. A plurality of memory cells are connected in series. According to the embodiment, for example, a memory array capable of achieving a larger capacity than that of a conventional, three-dimensionally stacked chain-type memory structure is provided.

In the embodiment, the plurality of conductive layers 10 may be arranged along the first face 60a of the base member 60.

According to the embodiment, it is possible to provide a semiconductor memory device capable of improving the storage density.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor memory devices such as conductive layers, insulating layers, semiconductor layers, intermediate layers, controller, base member, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor memory devices practicable by an appropriate design modification by one skilled in the art based on the semiconductor memory devices s described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
   a semiconductor layer extending in a first direction and including a first end portion and a second end portion;

a plurality of conductive layers and a plurality of insulating layers alternately provided along the first direction;

an intermediate layer provided between the plurality of conductive layers and the semiconductor layer; and a controller electrically connected with the plurality of conductive layers and the semiconductor layer, the controller being configured to perform a first operation and a second operation, in the first operation, the controller applying a first voltage to the semiconductor layer, applying a second voltage higher than the first voltage to a first conductive layer included in the plurality of conductive layers, and applying a third voltage between the first voltage and the second voltage to other conductive layers included in the plurality of conductive layers, and in the second operation, the controller applying a fourth voltage to the semiconductor layer, applying a fifth voltage lower than the fourth voltage to the first conductive layer, and applying a sixth voltage to the other conductive layers, the fourth voltage being between the fifth voltage and the sixth voltage, a first electrical resistance between the first end portion and the second end portion in a first state after the first operation being lower than a second electrical resistance between the first end portion and the second end portion in a second state after the second operation, the first electrical resistance including an electrical resistance of a current path along the first direction, the current path including a region of the intermediate layer, the region including metallic elements.

2. The device according to claim 1, wherein
the controller further performs a third operation in which the controller applies a seventh voltage to the first end portion, applies an eighth voltage higher than the seventh voltage to the second end portion, applies a ninth voltage to the first conductive layer, and applies a tenth voltage to the other conductive layers, an absolute value of a difference between the ninth voltage and the seventh voltage is smaller than an absolute value of a difference between the second voltage and the first voltage, and an absolute value of a difference between the tenth voltage and the seventh voltage is smaller than the absolute value of the difference between the second voltage and the first voltage.

3. The device according to claim 1, wherein
the plurality of conductive layers contain a metallic element of at least one of copper or silver, and
the intermediate layer contains at least one of $SiO_x$, SiON, $AlO_x$, $TaO_x$, $TiO_x$, $ZrO_x$, $GdO_x$, or $HfO_x$.

4. The device according to claim 3, wherein
the intermediate layer includes a first region between the first conductive layer and the semiconductor layer, and
a concentration of the metallic element in the first region in the first state is higher than a concentration of the metallic element in the first region in the second state.

5. The device according to claim 3, wherein
the intermediate layer includes a first region between the first conductive layer and the semiconductor layer,
the first region includes a conductive layer-side region and a semiconductor layer-side region provided between the conductive layer-side region and the semiconductor layer, and
a concentration of the metallic element in the semiconductor layer-side region in the first state is higher than a concentration of the metallic element in the conductive layer-side region in the first state.

6. The device according to claim 1, wherein
the intermediate layer contains silicon, oxygen, and nitrogen,
the intermediate layer includes a conductive layer-side region and a semiconductor layer-side region provided between the conductive layer-side region and the semiconductor layer, and
a concentration of nitrogen in the semiconductor layer-side region is lower than a concentration of nitrogen in the conductive layer-side region.

7. The device according to claim 1, wherein
the intermediate layer contains an anatase-type titanium oxide, and
the semiconductor layer contains silicon.

8. The device according to claim 7, wherein
the intermediate layer includes a first region between the first conductive layer and the semiconductor layer,
the first region includes a conductive layer-side region and a semiconductor layer-side region provided between the conductive layer-side region and the semiconductor layer, and
a concentration of oxygen in the semiconductor layer-side region in the first state is lower than a concentration of oxygen in the semiconductor layer-side region in the second state.

9. The device according to claim 7, wherein
the intermediate layer includes a first region between the first conductive layer and the semiconductor layer,
the first region includes a conductive layer-side region and a semiconductor layer-side region provided between the conductive layer-side region and the semiconductor layer, and
a concentration of oxygen in the semiconductor layer-side region in the first state is lower than a concentration of oxygen in the conductive layer-side region in the first state.

10. The device according to claim 1, wherein
the semiconductor layer extends in a stacked member including the plurality of conductive layers and the plurality of insulating layers in the first direction.

11. The device according to claim 7, wherein
the intermediate layer includes a conductive layer-side region and a semiconductor layer-side region provided between the conductive layer-side region and the semiconductor layer,
the intermediate layer includes a first region between the first conductive layer and the semiconductor layer, and
a concentration of oxygen in the semiconductor layer-side region of the first region in the first state is lower than a concentration of oxygen of the first region in the second state.

12. The device according to claim 7, wherein
the intermediate layer includes a conductive layer-side region and a semiconductor layer-side region provided between the conductive layer-side region and the semiconductor layer,
the intermediate layer includes a first region between the first conductive layer and the semiconductor layer, and
a concentration of oxygen in the semiconductor layer-side region of the first region in the first state is lower than a concentration of oxygen in the conductive layer-side region of the first region in the first state.

13. The device according to claim 1, wherein
a stacked member including the plurality of conductive layers and the plurality of insulating layers extends in a second direction crossing the first direction, and
the semiconductor layer overlaps the plurality of conductive layers in a third direction crossing the first direction and the second direction.

14. The device according to claim 13, further comprising another semiconductor layer, wherein
at least part of the stacked member is disposed between the semiconductor layer and the another semiconductor layer in the third direction.

15. The device according to claim 1, further comprising a base member including a first face, wherein
the plurality of conductive layers, the plurality of insulating layers, the semiconductor layer, and the intermediate layer are provided on the first face.

16. The device according to claim 15, wherein
the base member includes a semiconductor substrate, and
at least a portion of the controller is provided on the semiconductor substrate.

17. The device according to claim 1, wherein
a length of the first conductive layer in the first direction is 5 nanometers or more and 50 nanometers or less.

18. The device according to claim 1, wherein
a length of one of the plurality of insulating layers in the first direction is 5 nanometers or more and 50 nanometers or less.

19. The device according to claim 1, wherein
a distance between the first conductive layer and the semiconductor layer is 3 nanometers or more and 20 nanometers or less.

* * * * *